(12) United States Patent
Krivokapic

(10) Patent No.: US 6,255,711 B1
(45) Date of Patent: Jul. 3, 2001

(54) ENCROACHLESS LOCOS ISOLATION

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/398,916

(22) Filed: Sep. 16, 1999

Related U.S. Application Data

(62) Division of application No. 08/965,404, filed on Nov. 6, 1997.

(51) Int. Cl.$^7$ .................................................. H01L 29/00
(52) U.S. Cl. .......................... 257/509; 257/501; 257/506
(58) Field of Search .................................... 257/506, 501, 257/509; 438/225, 297, 410, 439, 770, 775, 440

(56) References Cited

U.S. PATENT DOCUMENTS

| | | | |
|---|---|---|---|
| 4,583,281 | 4/1986 | Ghezzo et al. | 29/576 |
| 4,868,136 | * 9/1989 | Ravaglia | 437/38 |
| 5,712,186 | 1/1998 | Thakur | 437/69 |
| 5,726,091 | 3/1998 | Tsai et al. | 438/439 |
| 5,863,817 | * 10/1999 | Chu et al. | 438/410 |
| 5,891,788 | 4/1999 | Fazan et al. | 438/439 |
| 5,930,649 | * 7/1999 | Park | 438/444 |

OTHER PUBLICATIONS

Stanley Wolf, Silicon Processing for the VSLI Era, vol. 1, Lattice Press, p. 36 (1990).

Stanley Wolf, Silicon Processing for the VSLI Era, vol. II, Lattice Press, p. 38 (1990).

Stanley Wolf, Silicon Processing for the VSLI Era, vol. III, Lattice Press, p. 363 (1995).

* cited by examiner

*Primary Examiner*—Steven Loke
*Assistant Examiner*—Douglas W. Owens
(74) *Attorney, Agent, or Firm*—LaRiviere, Grubman & Payne, LLP

(57) ABSTRACT

The present invention provides a fabrication process for fabricating an integrated circuit substrate structure having LOCOS isolation areas formed such that oxidation encroachment at an active surface region patterned on the substrate is less than 0.1 μm. The fabrication process includes various process steps for forming a 0.75 μm. to 1.0 μm layer of silicon dioxide ($SiO_2$) over thin layers of silicon dioxide (0.01 μm. to 0.05 μm) and silicon nitride (0.05 μm. to 0.10 μm) over a surface region of the substrate to form a protective stack/passivation layers over a surface region of the silicon substrate. The protected substrate surface region is useable for fabricating a microelectronic circuit device, such as a MOS transistor, or a flash memory device. Adjacent the protective stack, a silicon nitride spacer region is formed to effectively widen the protected substrate surface region. The silicon nitride spacer region limits the encroachment of oxide, commonly called bird's beak growth of oxide, into the active surface region beneath the spacer and protective stack. The resulting structure, after removal of the silicon nitride and other passivation layers, is one having an oxide encroachment region that is less than 0.1 μm.

7 Claims, 4 Drawing Sheets

ENCROACHLESS LOCOS ISOLATION

RELATED APPLICATIONS

This application is a divisional of U.S. patent application Ser. No. 08/965,404, filed Nov. 6, 1997.

TECHNICAL FIELD

The present invention relates to integrated circuits and fabrication techniques for electrically isolating the various components in an integrated circuit. More particularly, the present invention relates to integrated circuits and fabrication techniques that electrically isolate the various components by an isolation process known as LOCOS, which stands for localized oxidation of silicon.

BACKGROUND OF THE INVENTION

Microelectronic circuitry in the form of integrated circuits have utilized the deposition of films of silicon dioxide and silicon nitride as insulator or dielectric layers to electrically isolate independent circuit portions. Junction isolation utilizing by example, N-type material diffusion, N-type epitaxial layer deposition and P-type doping is a known scheme for electrically isolating P-type semiconductor material from N-type semiconductor material in an integrated circuit substrate structure. Other electrical isolation schemes include dielectric isolation whereby trenches are formed for receiving an oxide layer, a polysilicon material and for delineating silicon pockets on an opposing side. After processing, the oxide electrically separates the silicon pockets from the polysilicon layer. The junction and dielectric isolation processes require substantial surface area and have resulted in an alternative process termed LOCOS which conserves on the use of the surface area by selectively oxidizing patterns on a silicon substrate. A problem associated with the LOCOS isolation technique is the oxide encroachment of the silicon dioxide that results under the silicon nitride layer, see FIG. 7.0. The oxide encroachment is known in the industry as a bird's beak. The length of the beak relates to mechanical stress in the silicon which impacts the performance of circuits formed in that area. Solutions to minimize the stress problem include formation of a pad oxide under the silicon nitride and controlling the oxidation temperature and width of the active device. Other known processes include a variation of the LOCOS process which is known in the industry as SWAMI, as developed by Hewlett Packard. The SWAMI process includes outwardly etching the silicon nitride and the pad oxides at 60 degrees such that the subsequent oxidation and beak formation length is limited. Other methods include using high-pressure oxidation techniques where the oxidation is grown faster and at a lower temperature which results in minimizing the growth of the bird's beak.

The foregoing processes for minimizing the length of the bird's beak in LOCOS isolation are not deemed adequate for integrated circuit technologies in the sub-0.25 $\mu$m range. In this sub-micron range, the length of the bird's beak must be less than 0.1 $\mu$m to avoid formation of junction capacitance which results in leakage current paths. By example, computer memory products, such as flash memory using high density, sub-micron, single transistor cell MOS design, require isolation between cells that maintain their integrity throughout the life of the product. To applicant's knowledge, the use of fabricated silicon nitride spacers, in combination with pad oxide and silicon nitride layers has not been used to produce LOCOS isolation. The silicon nitride spacer surrounding the active part of the device prevents growth of oxide and thus prevents dislocation loops from forming in the MOS gate area which results in an encroachless LOCOS form of isolation. Further, this form of LOCOS isolation does not require a polishing process, which can cause gate oxide damage and formation of undesirable current leakage paths in subsequently formed microelectronic devices.

Thus, a primary object of the present invention is to provide a microelectronic integrated circuit substrate having LOCOS isolation structure whose oxidation encroachment region is substantially less than 0.1 $\mu$m.

A related object is to provide a fabrication process for producing a microelectronic integrated circuit substrate having LOCOS isolation structure in accordance with the foregoing primary object.

A specific object of the present invention is to provide a microelectronic integrated circuit substrate having fabrication structure comprising silicon nitride spacers for producing a LOCOS isolation structure whose oxidation encroachment region is substantially less than 0.1 $\mu$m.

Another related object is to provide a fabrication process for producing a microelectronic integrated circuit substrate having LOCOS isolation structure in accordance with the foregoing specific object.

BRIEF SUMMARY OF THE INVENTION

Accordingly, the foregoing objects are accomplished by providing a fabrication process for fabricating an integrated circuit substrate structure having LOCOS isolation areas formed such that the oxidation encroachment at a surface region patterned on a surface of the substrate is less than 0.1 $\mu$m. The process comprises deposition steps for forming a 0.75 $\mu$m to 1.0 $\mu$m layer of silicon dioxide ($SiO_2$) over thin layers of silicon dioxide (0.01 $\mu$m to 0.05 $\mu$m) and silicon nitride (0.05 $\mu$m to 0.10 $\mu$m) over a surface region of the substrate, which may be used for fabricating a microelectronic circuit element, such as a MOS transistor. Adjacent the forgoing stack of passivation layers, silicon nitride spacers are formed to effectively widen the protected surface region where a circuit element may be formed. The silicon nitride spacer formed limits the growth of oxide into the active surface region. The resulting structure, after removal of the silicon nitride, is one having an oxide encroachment region, comprising silicon dioxide, that is less than 0.1 $\mu$m. The resulting encroachment region, is best described as being less than 0.1 $\mu$m at a surface level of said surface region and having a slight bowing formation of silicon dioxide into the body of the silicon substrate material. The encroachment region is preferably not characterized as a bird's beak.

Other features of the present invention are disclosed or apparent in the section entitled: "DETAILED DESCRIPTION OF THE INVENTION".

BRIEF DESCRIPTION OF DRAWING

For fuller understanding of the present invention, reference is made to the accompanying drawing in the following Detailed Description of the Invention. In the drawings.

Figure 1:
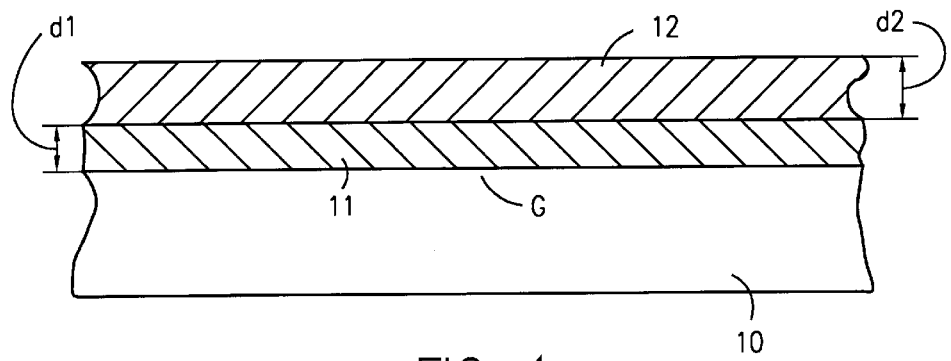
FIG. 1 is a cross-section of a semiconductor substrate shown at a fabrication stage having a plurality of passivation layers in preparation for being fabricated in accordance with the present invention.

Reference numbers refer to the same or equivalent parts of the present invention throughout the several figures of the drawing.

DETAILED DESCRIPTION OF THE INVENTION

Figure 2:
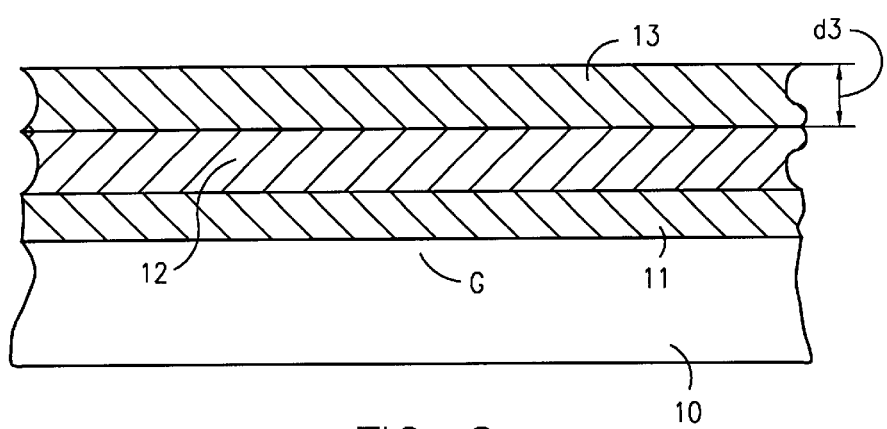
FIG. 2 is a semiconductor substrate fabricated as depicted in FIG. 1 having a third passivation layer fabricated in accordance with the present invention.

FIG. 1 is a cross-section of a semiconductor substrate 10 shown at a fabrication stage having a plurality of passivation layers 11 and 12 formed in preparation for being fabricated in accordance with the present inventions. By example, substrate 10 is preferably a silicon semiconductor substrate material having layer 11 formed from silicon dioxide thermally grown to a thickness d1 in the range of 0.01 $\mu$m. to 0.05 $\mu$m. Layer 11 may be formed by placing substrate 10 in an oxygen-containing atmosphere and heating the substrate to a temperature in the range of 750° C. to 850° C. for approximately five minutes. For purposes associated with providing higher dielectric protection of the underlying substrate surface region G, layer 12 is formed over the silicon dioxide by depositing silicon nitride to a thickness d2 in the range of 0.05 $\mu$m. to 0.10 $\mu$m. The silicon nitride is preferably deposited using low-pressure chemical vapor deposition (LPCVD) techniques. FIG. 2 is a semiconductor substrate fabricated as depicted in FIG. 1 having a third passivation layer 13 fabricated in accordance with the present invention. Passivation layer 13 is thicker than layers 11 and 12 and is preferably formed as a silicon dioxide layer using tetraethylorthosilicate (TEOS) as the source for deposition of silicon dioxide. The thickness d3 of layer 13 is preferably in the range of 0.75 $\mu$m to 1.0 $\mu$m and serves to add height to the passivation layer stack and provide better protection of the active surface region.

Figure 3:
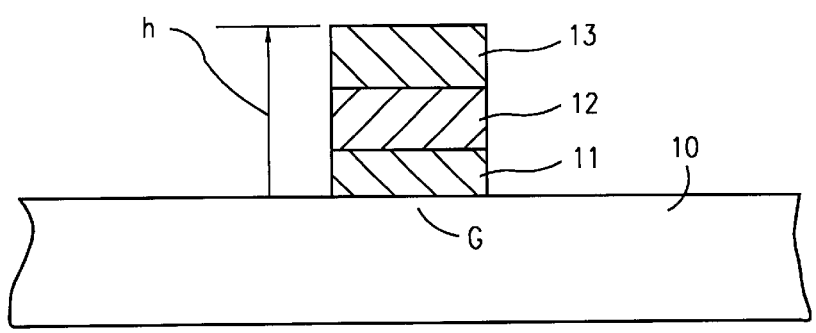
FIG. 3 shows a surface region which remains after the three-layer passivation semiconductor substrate depicted in FIG. 2 has been processed in accordance with the present invention.
Figure 4:
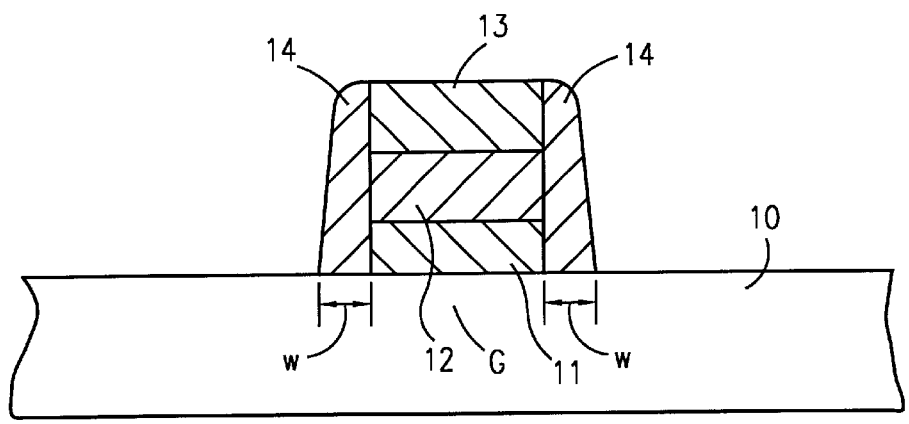
FIG. 4 is a cross-section of a semiconductor substrate fabricated as depicted in FIG. 3 having a spacer portion fabricated about the stack of passivation layers fabricated over the surface region using a passivation material identical to a mid-layer passivation material depicted in FIG. 3.
Figure 5:
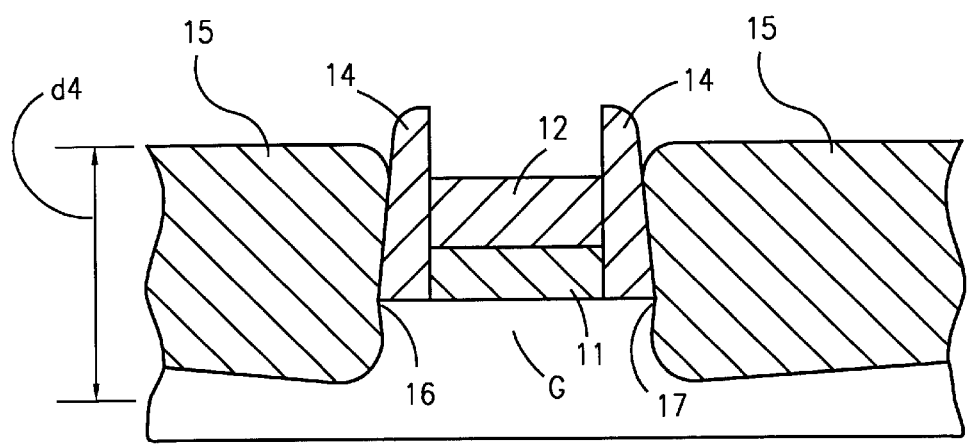
FIG. 5 is a cross-section of a semiconductor substrate fabricated as depicted in FIG. 4 shown having the gate region substantially masked for facilitating fabrication of isolation oxide regions (encroachless LOCOS isolation) at the source and drain regions without formation of bird's beak at the semiconductor substrate surface.

FIG. 3 shows the active surface region G which is delineated beneath the three-layer passivation stack 11, 12, 13 that remains after a photomasking and etching process performed on the semiconductor substrate depicted in FIG. 2. The three-layer passivation stack comprises a height h which is basically the sum of layer thicknesses d1, d2, and d3. FIG. 4 is a cross-section of a semiconductor substrate fabricated as depicted in FIG. 3 having spacer portions 14 fabricated about the three-layer passivation stack 11, 12, and 13. Spacer portions 14 are formed having a thickness w, in the range of 0.05 $\mu$m to 0.15 $\mu$m, and are formed by etching subsequent to formation of a thermally grown silicon dioxide layer and LPCVD layer of silicon nitride over the silicon substrate surface surrounding the three-layer passivation stack. Spacer portions 14 are formed by dry etching, by example dry plasma etching, of the silicon nitride layer to create silicon nitride spacer portions 14 having a height h, which comprises the sum of layer thicknesses d1, d2, and d3. FIG. 5 is a cross-section of the semiconductor substrate fabricated as depicted in FIG. 4 after wet etching of the TEOS formed silicon dioxide layer 13 and having substrate surface region G protected by two-layer passivation stack 11 and 12 and spacer portions 14. Isolation oxide regions 15 are formed by a wet oxidation process which result in silicon dioxide being grown to a thickness d4 in the range of 0.40 $\mu$m. to 0.70 $\mu$m. The isolation oxide regions 15 grown in accordance with the foregoing process are limited in the amount of oxide encroachment onto the adjacent silicon substrate surface region due to the protective barrier comprising the silicon nitride spacer portion 14 and the stack of passivation layers 11, 12. The oxide encroachment is limited to a distance that is no greater than 0.1 $\mu$m onto the silicon substrate surface at substrate regions 16 and 17.

Figure 6:
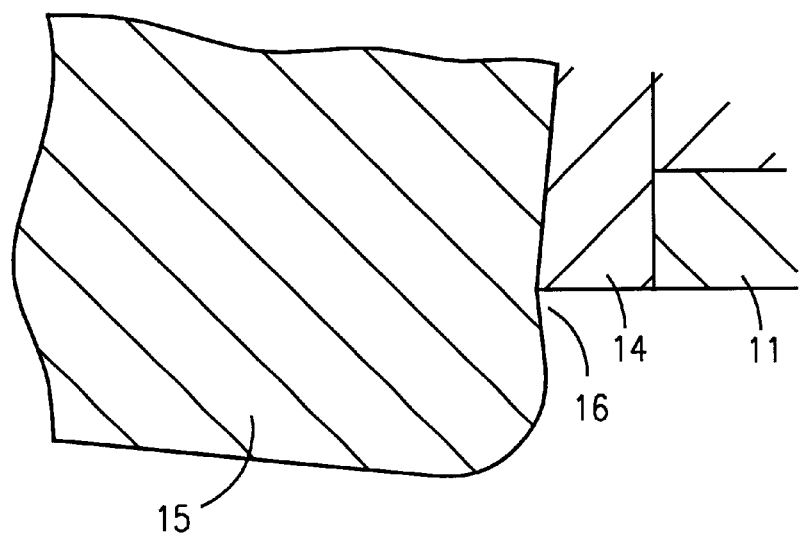
FIG. 6 is an enlarged cross-section of the oxidation-substrate junction region of a semiconductor substrate fabricated as depicted in FIG. 5 showing an oxidation encroachment having a slight bowing shape in accordance with the present invention.
Figure 7:
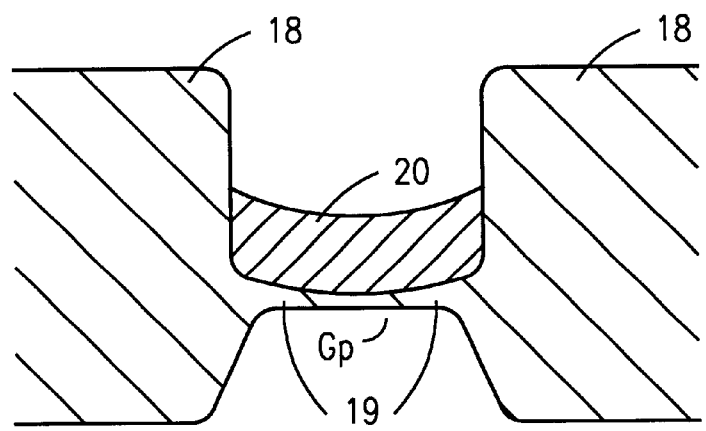
FIG. 7 is a cross-section of a semiconductor substrate having a gate region fabricated according to prior art processes having isolation oxide regions extending beneath the passivation layer and forming a bird's beak at the semiconductor surface.

FIG. 6 shows an enlarged cross-section of substrate region 16 of a semiconductor substrate 10 fabricated as depicted in FIG. 5. Region 16 is shown having a slight bowing encroachment of the oxide isolation into the silicon substrate. By comparison, and exemplary of the encroachless characteristic of the present invention, FIG. 7 shows a cross-section of a prior art semiconductor substrate having a substrate region Gp, which is analogous to substrate surface region G, fabricated according to prior art processes where isolation oxide regions 18 extend beneath the passivation layer 20 forming bird's beak 19 at the underlying semiconductor surface. The bowing encroachment of the oxide isolation 15 is considered to be in a deep region of silicon substrate 10 and is viewed as being beneficial since it will reduce the area of p-n junction, and thus results in reduced junction capacitance.

Figure 8:
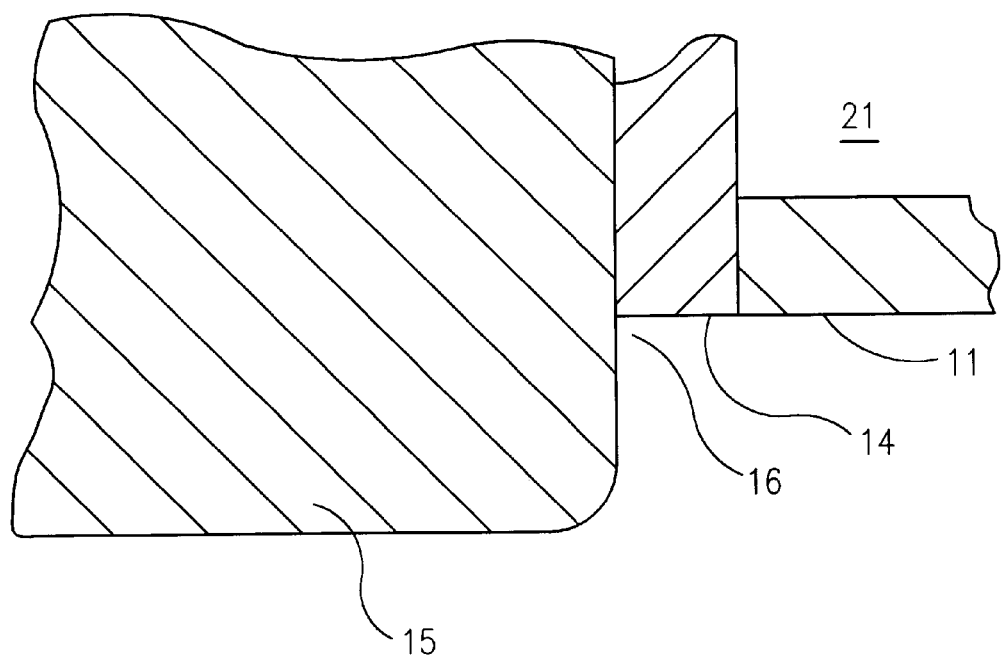
FIG. 8 is an enlarged cross-section of the oxidation-substrate region as depicted in FIG. 6 showing the relative placement of subsequent micro devices such as a flash memory.

FIG. 8 depicts the deice of FIG. 6 showing placement of subsequently formed microdevices 21 such as a flash memory on the substrate prepared in accordance with the present invention.

The present invention has been particularly shown and described with respect to a certain preferred embodiment and features thereof. However, it should be readily apparent to those of ordinary skill in the art that various changes and modifications in form, semiconductor material, material conductivity type, i.e. N-type, or P-type, and detail may be made without departing from the spirit and scope of the inventions as set forth in the appended claims. The inventions illustratively disclosed herein may be practiced without any element which is not specifically disclosed herein.

What is claimed is:

1. A semiconductor apparatus, said apparatus comprising:
   a semiconductor substrate member with an upper side;
   at least one flat surface region patterned on a surface on the upper side of said substrate member, said flat surface region being in a ready-state for fabricating thereon at least one semiconductor microelectronic device; and
   an electrically isolating material region formed about said at least one flat surface region, said isolating material region be in formed in a contacting adjacent relationship with said at least one flat surface region and extending in a sub-surface manner into said substrate member, said isolating material region being formed such that a surface encroachment portion of said isolating material region extends towards said at least one flat surface region a distance that is less than 0.1 μm, wherein said isolating material region has an upper portion sidewall slightly angled away from vertical and a bowing encroachment beneath said flat surface region and upper portion sidewall of said isolating substrate is greater than said surface encroachment.

2. A semiconductor apparatus as described in claim 1, wherein:

said substrate member comprises a silicon substrate member; and said electrically isolating material region comprises silicon dioxide.

3. A semiconductor apparatus as described in claim 1, wherein:

said substrate member comprises a silicon substrate member;

said electrically isolating material region comprises silicon dioxide; and said semiconductor apparatus further comprises a flash memory microelectronic device fabricated on said flat surface region.

4. A semiconductor apparatus for facilitating localized oxidation on silicon, said apparatus comprising:

a silicon substrate member;

a protective stack portion comprising at least one passivation layer of an insulator material, said stack portion having a stack portion width said stack portion being fabricated on said silicon substrate member for protecting an underlying substrate surface region being protected for use in subsequent fabrication of at least one semiconductor microelectronic device, said protective stack portion having a first passivation layer of silicon dioxide, a second passivation layer of silicon nitride, and a third passivation layer of silicon dioxide, said first passivation layer being fabricated in surface contact with said silicon substrate member, said second passivation layer being disposed between said first and third passivation layer;

a spacer region fabricated about said protective stack portion, said spacer region being silicon nitride, said spacer region having a spacer region width that correspondingly extends in the range of 0.05 to 0.15 micrometers, said spacer region having a height dimension that is substantially equivalent to a height dimension of said protective stack portion;

an unprotected silicon substrate surface region surrounding said fabricated spacer region and protective stack portion, said unprotected silicon substrate surface region being in a ready-state for fabricating thereon an electrically isolating material to facilitate fabrication of a semiconductor substrate having localized oxidation on silicon characteristics; and an electrically isolating oxide material region grown on said unprotected silicon substrate, said isolating oxide material region being grown adjacent said spacer region and having a surface encroachment over said underlying surface region and beneath said spacer region and stack portion that is less than 0.1 micrometer and wherein said isolating oxide material region has a bowing encroachment in a deep region of the substrate below the surface encroachment, so that the encroachment in a deep region of the substrate is greater than said surface encroachment.

5. A semiconductor apparatus as described in claim 4, wherein:

said first passivation layer comprising silicon dioxide having a thickness dimension ranging from 0.01 μm. to 0.05 μm;

said second passivation layer comprising silicon nitride having a thickness dimension ranging from 0.05 μm. to 0.10 μm;

said third passivation layer comprising silicon dioxide having a thickness dimension ranging from 0.75 μm. to 1.0 μm; and said electrically isolating material region comprising silicon dioxide having a thickness dimension ranging from 0.40 μm. to 0.70 μm.

6. The semiconductor apparatus, as recited in claim 5, wherein said underlying substrate surface region is flat.

7. The semiconductor apparatus, as recited in claim 4, wherein said underlying substrate surface region is flat.

* * * * *